United States Patent [19]

Shimizu

[11] Patent Number: 4,588,472
[45] Date of Patent: May 13, 1986

[54] METHOD OF FABRICATING A SEMICONDUCTOR DEVICE

[75] Inventor: Isao Shimizu, Tamamura, Japan

[73] Assignee: Hitachi, Ltd., Tokyo, Japan

[21] Appl. No.: 574,085

[22] Filed: Jan. 26, 1984

[30] Foreign Application Priority Data

Jan. 26, 1983 [JP] Japan ................... 58-9800

[51] Int. Cl.⁴ ............... H01L 21/306; B44C 1/22; C03C 15/00; C03C 25/06
[52] U.S. Cl. ............................ 156/628; 148/175; 148/187; 29/576 B; 29/580; 29/610 SG; 156/647; 156/653; 156/657; 156/662; 73/777; 338/4; 357/55
[58] Field of Search ............ 156/628, 643, 647, 653, 156/657, 659.1, 662; 148/1.5, 187, 175; 29/576 B, 580, 610 SG; 338/2, 4, 47; 357/26, 55, 60; 73/777

[56] References Cited

U.S. PATENT DOCUMENTS

| | | | |
|---|---|---|---|
| 3,893,228 | 7/1975 | George et al. | 29/580 |
| 4,108,715 | 8/1978 | Ishikawa et al. | 156/628 |
| 4,293,373 | 10/1981 | Greenwood | 156/628 |

FOREIGN PATENT DOCUMENTS

| | | |
|---|---|---|
| 0037876 | 10/1981 | European Pat. Off. . |
| 2229457 | 1/1973 | Fed. Rep. of Germany . |
| 3345988 | 6/1984 | Fed. Rep. of Germany . |
| 1211499 | 11/1970 | United Kingdom . |
| 1278210 | 6/1972 | United Kingdom . |
| 1558815 | 1/1980 | United Kingdom . |
| 1584915 | 2/1981 | United Kingdom . |
| 1588669 | 4/1981 | United Kingdom . |
| 2121646 | 12/1983 | United Kingdom . |
| 2135509 | 8/1984 | United Kingdom . |

OTHER PUBLICATIONS

IEEE Electron Device Letters, vol. EDL-2, No. 2, Feb. 1981, An Electrochemical P-N Junction Etch-Stop for the Formation of Silicon Microstructures, Jackson et al., pp. 44–45.

J. Electrochem. Soc., vol. 118, No. 2, Feb. 1971, Ethylene Diamine-Pyrocatechol-Water Mixture Shows Etching Anomaly in Boron-Doped Silicon, Bohg, pp. 401–402.

IEDM Technical Digest, Dec. 1978, Diaphragm Formation and Pressure Sensitivity in Batch-Fabricated Silicon Pressure Sensors, Wise et al., pp. 96–99.

Allan, "New Applications Open Up for Silicon Sensors: A Special Report", in *Electronics* (Nov. 6, 1980), pp. 113–122.

Angell et al., "Mikromechanik Aus Silicium", in *Spektrum der Wissenschaft* (Jun. 1983), pp. 38–50.

"Dreidimensionale Strukturierung des Siliciums Zum Herstellen von Sensoren", in Elektronik Produktion & Pruftechnik (Mar. 1983), pp. 110–112.

*Primary Examiner*—William A. Powell
*Attorney, Agent, or Firm*—Antonelli, Terry & Wands

[57] ABSTRACT

This invention relates to the method of forming a semiconductor device having a diaphragm.

A highly doped semiconductor region is formed in the peripheral portion of the semiconductor substrate around the part in which the diaphragm is to be formed, and then that part is etched. Thereby, the diaphragm of a semiconductor pressure sensor can be formed very accurately to a desired shape.

12 Claims, 15 Drawing Figures

METHOD OF FABRICATING A SEMICONDUCTOR DEVICE

BACKGROUND OF THE INVENTION

The present invention relates to a method of forming a semiconductor diaphragm and, in particular, to a method of forming a silicon diaphragm type pressure sensor.

The semiconductor pressure sensor can be of small size, low cost and high performance as compared with a mechanical pressure sensor using a bourdon tube or a bellows, and a silicon diaphragm type pressure sensor is typical of the semiconductor pressure sensor. The structure of the silicon diaphragm type pressure sensor is disclosed in, for example, "Diaphragm Formation and Pressure Sensitivity in Batch-Fabricated Silicon Pressure Sensors", *IEDM Technical Digest,* December, 1978, pp. 96–99.

According to this publication, it has been considered to control the thickness of the diaphragm.

However, while it is also very important to make uniform the size and shape of such diaphragms, the importance of obtaining this uniform diaphragm size and shape has not yet been sufficiently recognized.

When forming such diaphragms, generally speaking, an anisotropic etching technique is frequently used. This is because the thickness of the diaphragm can be controlled easily when using this etching technique.

Incidentally, in order to obtain uniform strains generated in four diffused piezoresistors by the pressure applied to a diaphragm, it is desirable that the diaphragm be circular. However, when an Si substrate having a (100) crystallographic plane is selectively etched by the anisotropic etching technique, even if the selective etching is performed using a mask with a circular opening, a completely circular diaphragm is difficult to form because of the etching being a function of the crystallographic direction, so that the diaphragm structure formed has an octagonal or similarly polygonal shape. With this polygonal shape, the distance from the center to the periphery of the diaphragm is different at the edges and vertices thereof, which means that the strain is liable to be irregular over the diaphragm surface, thereby inevitably making variations in the diffused piezoresistors irregular. There is also the problem that the size and shape of the diaphragm varies according to the etching time.

SUMMARY OF THE INVENTION

It is an object of the present invention to form a controlled recess in part of a semiconductor substrate by etching.

Another object of the present invention is to provide a semiconductor pressure sensor having a controlled diaphragm.

When a recess is to be formed by etching in part of a principal plane of a semiconductor substrate, according to the present invention, a highly doped region is formed in the peripheral portion of the semiconductor substrate excluding the part at which the recess is to be formed, and the part is then etched so that the excessive lateral etching is restrained by the highly doped region. As a result, a controlled recess can be obtained by the present invention.

DESCRIPTION OF THE PREFERRED EMBODIMENTS

Figure 1:
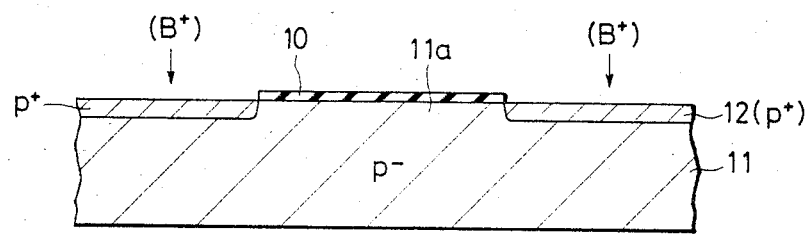
FIG. 1 and FIGS. 3–10 are sections showing steps in a process of fabricating a pressure sensor to which the present invention is applied.
Figure 2:
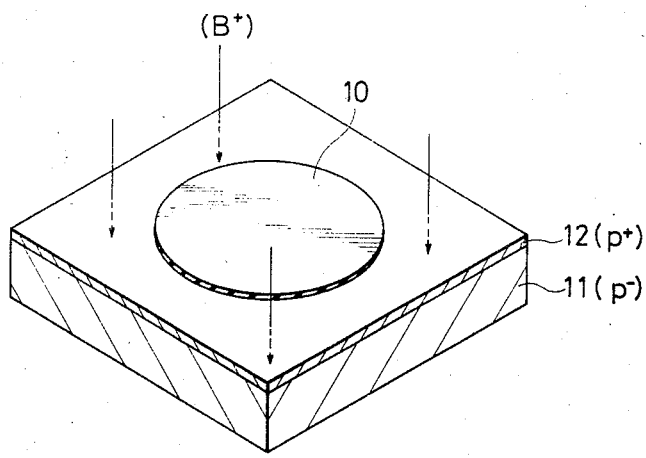
FIGS. 2 and 11 are perspective views of the process of fabricating the pressure sensor.

A concrete embodiment of the present invention will now be described in detail with reference to FIGS. 1 to 11:

(1) A $p^-$-type single crystal silicon substrate (or Si wafer) of a high resistivity (e.g., about 25 ohm-cm to 50 ohm-cm), which has either a crystal plane (100), or a crystal plane adjacent thereto, relative to the major sides thereof, is prepared. As shown in FIGS. 1 and 2, impurities are selectively introduced into the reverse side (or the first principal plane), of the major sides, of the silicon substrate 11 by deposition or ion implantation using a mask 10. This introduction of impurities is an extremely important step in achieving the objects of the present invention, as will be described hereinafter. The impurities used may be either p-type or n-type. According to the present embodiment, impurities such as boron ions (B), are introduced by, e.g., ion implantation into the peripheral portion of the substrate 11 around a region 11a (in which a recess will be formed), to provide a p-type, highly doped region 12 (e.g., doped to at least about $10^{19}$ atoms/cm$^3$) This highly doped region can also be formed by other, conventional means, such as predeposition and diffusion. The part into which no impurities are introduced is formed so as to have a circular shape, for example. As shown in FIG. 2, more specifically, this part may be covered with the circular mask 10.

It is preferable that the energy with which the boron ions are implanted is between 75 KeV to 125 KeV, and that the implanted dose is between to $10^{16}$ atoms/cm$^2$. In case of a single dose of the specified dose and energy, the impurity concentration of at least $10^{19}$ atoms/cm$^3$ can be distributed about 10 micron in depth. The number of times that the ion implantation is repeated depends on the desired depth. For example, in the present embodiment, the ion implantation is repeated 10 times in order to obtain an impurity concentration of at least $10^{19}$ atoms/cm$^3$ distributed to about 100 micron in depth.

The mask 10 could be an insulating film, such as $SiO_2$ film, or a photoresist film or a silicon nitride film can be used. In short, it is sufficient that the mask 10 is made of a material which blocks the introduction of the impurities into the substrate.

Figure 3:
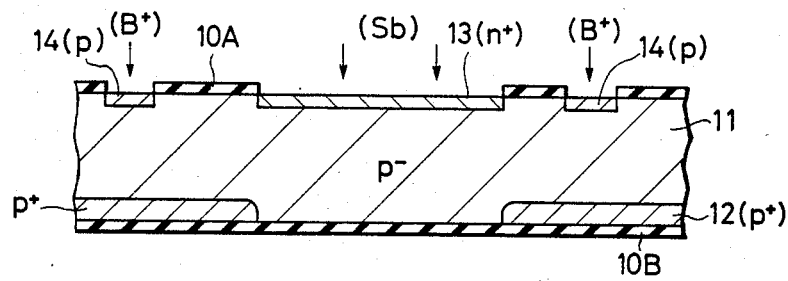

(2) After removal of the mask 10, oxide films 10A and 10B are formed over both principal planes of the substrate. N-type impurities, such as antimony ions (Sb), are selectively introduced into the surface (the second principal plane) of the substrate adjacent to the region 11 using the oxide film 10A of $SiO_2$ as a mask, as shown in FIG. 3, to form an $n^+$-type impurity region 13. Such impurity is introduced at a concentration of, e.g., $10^{19}$ atoms/cm$^3$. Other n-type impurities which can be implanted include phosphorous. When the method used for the introduction of the n-type impurities is predeposition, impurities such as $Sb_2O_3$ can be deposited on the surface of the Si wafer by placing a solid impurity source of $Sb_2O_3$ together with the Si wafer in a quartz tube, using Ar and $O_2$ as carrier gases, and keeping the furnace holding the quartz tube at 900° C. When ion implantation is used, on the other hand, the substrate surface (i.e., the second principal plane) on which the epitaxial region is to be formed would be damaged by ions if the ions were implanted to a high density by a single operation. Therefore, ion implantation is conducted with the implantation energy of between 75 KeV and 125 KeV at the dose of $1 \times 10^{14}$ atoms/cm$^2$, and this ion implantation is repeated 2–3 times.

A p-type isolation region 14 is formed separate from, but surrounding, the $n^+$-type region 13. This isolation region is formed by conventional procedures, such as ion implantation or predeposition and diffusion. A p-type impurity, such as boron, can be used to form said region 14. The region 14 is formed to have an impurity concentration of, e.g., $10^{19}$–$10^{20}$ atoms/cm$^3$. The $n^+$-type region 13 and the p-type region 14 are formed independently of each other; the order of these formations is not particularly restricted. The p-type isolation region 14 is very useful when the pressure sensor and other circuit elements are to be formed on a single semiconductor substrate.

Figure 4:
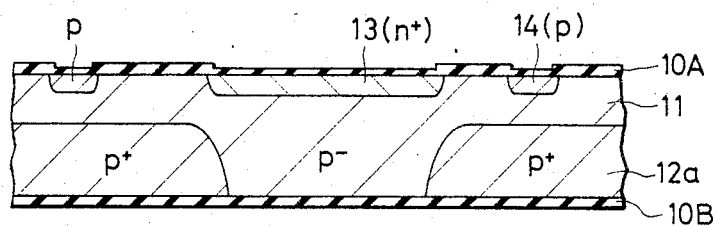

(3) To provide a drive-in diffusion, heat treatment (at least 1,000° C.) is conducted in an oxidizing atmosphere to diffuse a high concentration of impurities into the peripheral portion of the reverse surface of the substrate, as shown in FIG. 4, to form a deep $p^+$-type region 12a with an impurity concentration of at least $10^{19}$ atoms/cm$^3$.

Figure 5:
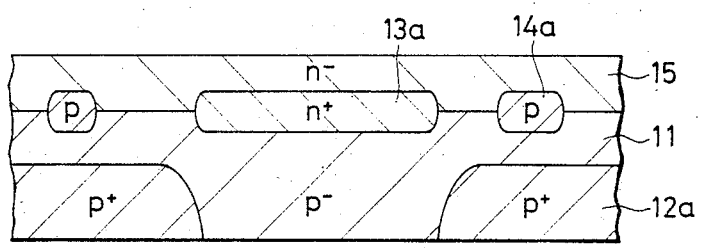

(4) After the oxide films 10A and 10B are removed, an n-type Si region 15, having low concentration of n-type impurity ions, is formed to the thickness of 25 to 30 $\mu$m over the upper surface of the substrate, as shown in FIG. 5, by epitaxial growth. Such n-type Si region 15 has an impurity concentration of, e.g., $10^{14}$–$10^{16}$ atoms/cm$^3$. This epitaxial growth changes the $n^+$-type region 13 of the substrate surface into an $n++$-type buried region 13a. The epitaxial growth is preferably conducted by the thermal decomposition of silane ($SiH_4$) at about 1,100° C.

Figure 6:
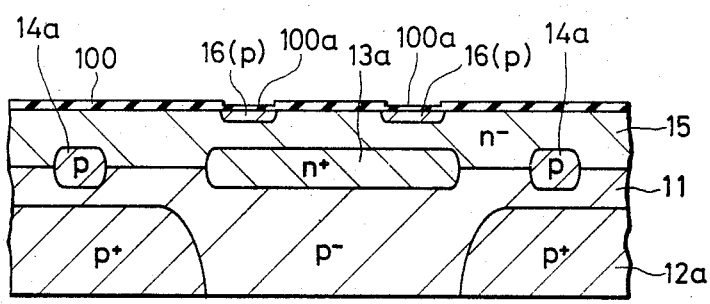

(5) As shown in FIG. 6, boron ions are selectively diffused into parts of the surface of the n-type Si region 15 to form p-type diffused regions 16 for gauge resistors. These p-type diffused regions 16 are of a size and positioned, e.g., relative to the diaphragm, as in conventional silicon diaphragm-type pressure sensors. A suitable method of forming the p-type diffused regions 16 will be described in the following.

First of all, an insulating film 100 is formed over the surface of the Si region 15. The method of forming the insulating film 100 can be thermal oxidation. Specifically, the surface of the Si region 15 is oxidized so that the oxidized film 100 (i.e., an $SiO_2$ film) is formed by heating the Si substrate 11 on which the Si region 15 is formed in an atmosphere of wet $O_2$ at 1,000° C. for 110 mins. Next, in order to selectively form four semiconductor resistor regions in the Si region 15 above the $n^+$-type buried region, the oxide film 100 is selectively removed by a well-known photo-etching technique to expose parts of the n-type Si region 15. P-type impurities such as boron ions (B) are introduced into the exposed surfaces of the Si region 15 by predeposition or ion implantation, so that p-type diffused regions 16 of a depth of 2 to 3 $\mu$m and a sheet resistance of 100 ohm per square are formed by the drive-in diffusion of the p-type impurities into the Si region 15. The predeposition is conducted by depositing solid $B_2O_3$ over the surface of the Si wafer by placing a solid impurity source of $B_2O_3$ together with the Si wafer in a quartz tube, keeping the interior of the quartz tube evacuated, and heating the quartz tube to about 900° C. When predeposition is used, after the drive-in diffusion, the boron glass covering the surfaces of the diffused regions 16 and the oxide film 100 is removed. After that, a thin oxide film 100a is formed over the diffused regions 16 by oxidizing the exposed surfaces of the diffused regions 16.

On the other hand, in case of ion implantation, the boron ions are implanted into the Si wafer at an implantation energy of 75 KeV and a dose of $1 \times 10^{13}$ atoms/cm$^2$. In order to prevent the surface of the Si region 15 from being damaged by the ions during ion implantation, it is preferable that the oxide film 100a is formed before the ion implantation, and that the boron ions are then introduced through the oxide film 100a into the Si region 15. Further, the thin oxide film (100, 100a) is formed by thermal oxidation.

Figure 7:
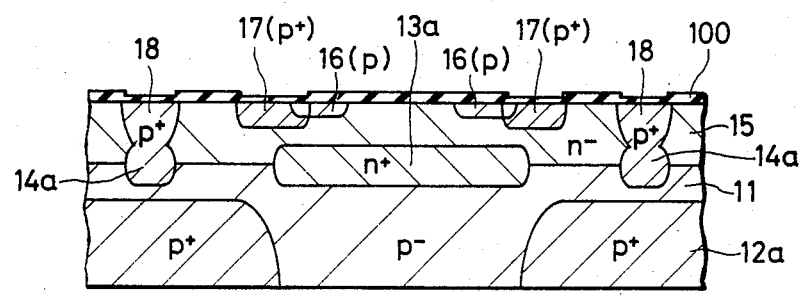

(6) As shown in FIG. 7, highly doped $p^+$-type diffused regions 17 for contacts are formed so that they are connected to the terminals of the diffused gauge resistors 16. Such regions 17 for contacts are regions doped to concentrations conventionally utilized in contact regions, and are formed by procedures conventionally used in forming diffused regions for contacts. Simultaneously with the formation of the diffused regions 17, $p^+$-type diffused regions 18 are formed so as to come into contact with the p-type buried isolation region 14a, to complete the isolation region.

Figure 8:
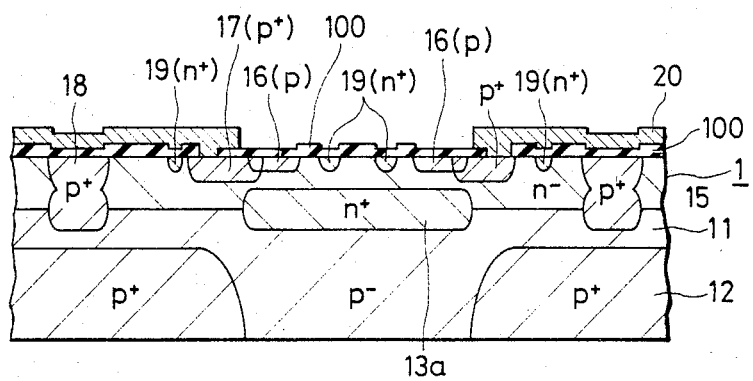

(7) As shown in FIG. 8, $n^+$-type regions 19 for channel stoppers are formed so as to enclose each of the diffused regions (the gauge resistors or the piezoresistive elements) 16. The regions 19 are formed by, e.g., ion implantation with boron ions. Such implantation is performed, e.g., at a dose of $10^{13}$ atoms/cm$^2$ and an implantation energy of 125 KeV. After that, the oxide film 100 is subjected to a conventional contact photoetching treatment to expose diffused regions 17, and Al wirings 20 are covered with a passivation film (not shown) of plasma nitride or PSG (Phosphorus Silicate Glass). This passivation film preferably has a thickness of about 1.2 $\mu$m, and is formed to prevent contamination of the oxide film 100 by the surrounding atmosphere. In particular, the plasma nitride is desirably used because it has a stable film quality. However, a laminated film in which PSG film (about 0.2 $\mu$m thickness) and plasma nitride film (about 1.1 $\mu$m thickness) are formed one over the other, can be used as the passivation film.

Figure 9:
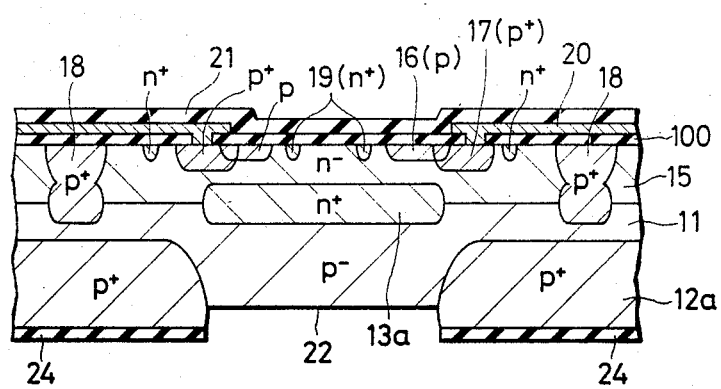
Figure 10:
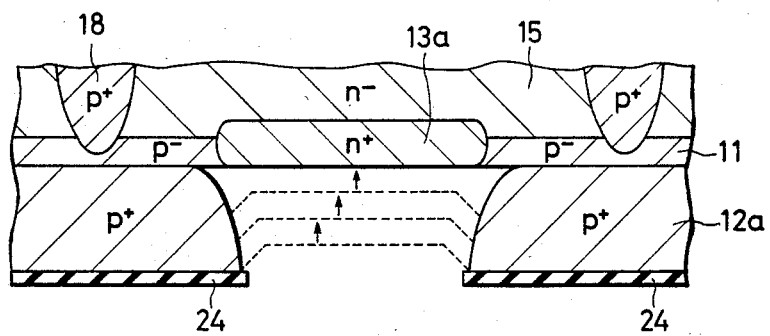
Figure 11:
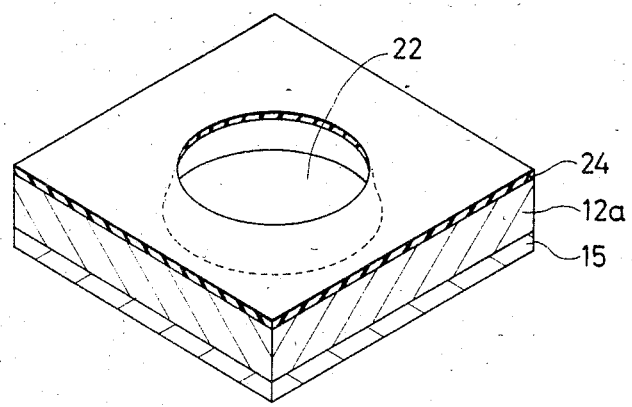

(8) In order to form the diaphragm, as shown in FIGS. 9 and 11, a photoresist mask 24 is formed over the $p^+$-type region 12a in the peripheral portion of the reverse surface of the substrate, and the substrate is anisotropically etched in a selective manner by alkaline etchants, such as KOH, to form a recess 22 in the unmasked central portion thereof. Reference numeral 21 indicates the passivation film.

Figure 12:
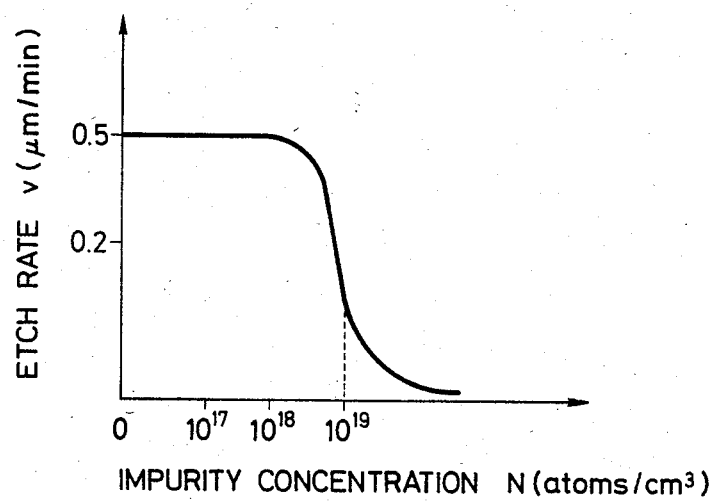
FIG. 12 is a graph showing the relationship between impurity concentration in a semiconductor substrate and etching rate with anisotropic etching using alkaline etchants.

Due to the characteristics of anisotropic etching, the etching rate differs greatly according to different impurity concentrations in the semiconductor substrate. As illustrated in FIG. 12, more specifically, the etching rate (v) drops abruptly at about the high impurity concentration of $10^{19}$ atoms/cm$^3$. As a result, during this etching step, the central substrate portion which has a low impurity concentration is etched consecutively and rapidly in the direction of the arrows, as shown by the broken lines in FIG. 10, whereas the highly doped peripheral region 12a is hardly etched at all. Consequently, the etching follows the shape of side surfaces of the diffused region 12a. More specifically, etching in the lateral direction of the substrate is restrained because of the formation of the diffused region 12a. This means that a circular recess 22 is formed if the mask used when the diffused region 12a is selectively formed has a circular pattern. When the etching reaches the highly doped n+-type buried region 13a, the etching rate drops abruptly so that a flat base for the recess is obtained as a result of the slowing down of the etching. Thus, a diaphragm of a thickness of 25 to 30 μm (substantially equal to that of the epitaxial region) is achieved.

Figure 13:
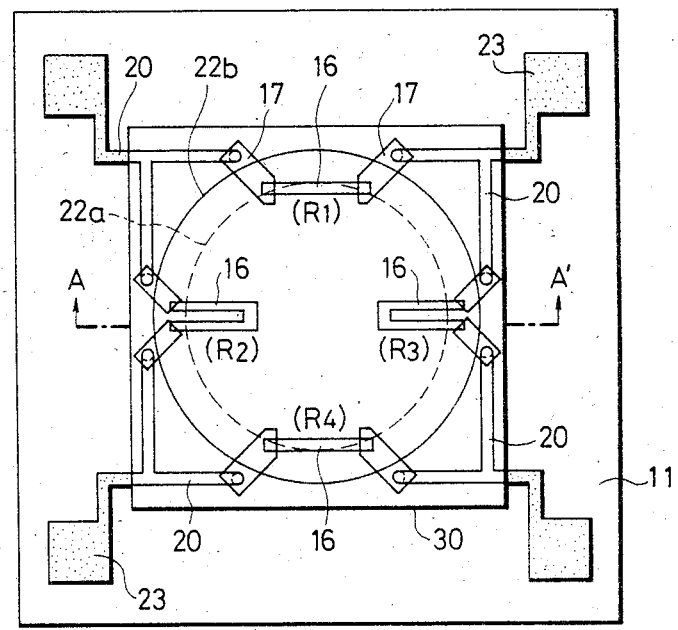
FIG. 13 is a plan view of the completed diaphragm pressure sensor according to the present invention, viewed from the plane in which gauge resistors are formed.

FIG. 13 is a plan view of a diaphragm pressure sensor completed by the specific method of the present invention thus far described. In FIG. 13, a circle 22b, indicated by a solid line, is the shape of a thin film portion providing this diaphragm, and a circle 22a, indicated by a broken line, is the shape of the opening of the recess (i.e., the pattern of the mask used to selectively form the highly doped region on the back of the substrate). Reference numeral 30 indicates a passivation film which is made of one of the materials specified below, and which covers all the second principal plane of the substrate in such a manner that terminals (or bonding pads) 23 are exposed. This passivation film 30 may be, e.g., a film of CVD SiO$_2$ or a polyimide resin.

Figure 14:
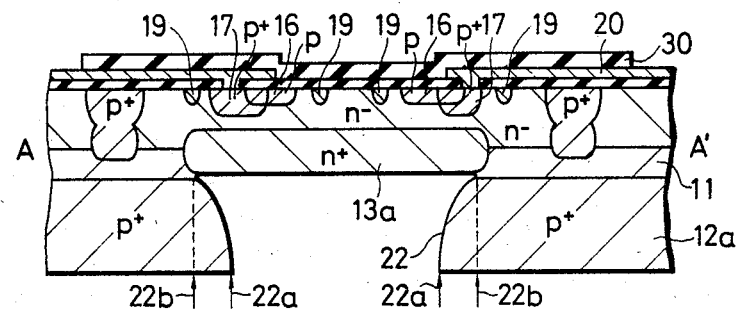
FIG. 14 is a section taken along the line A—A' of FIG. 13.

As shown in FIG. 13, the plurality of p-type diffused regions 16 for gauge resistors (R$_1$, R$_2$, R$_3$ and R$_4$) are arranged at four places on the surface of the thin film portion, parallel to the direction of the axis <110> with the highest piezoresistive effect, and respective terminals thereof are formed of highly doped p+-type regions 17, with which the Al wirings 20 come into contact. The Al wirings 20 connect the gauge resistors R$_1$, R$_2$, R$_3$ and R$_4$ in the form of a bridge network with the peripheral terminals 23. FIG. 14 is a section taken along the line A—A' of FIG. 13. The n+-type regions 19 acting as channel stoppers in FIG. 14 are omitted from FIG. 13; they are each formed in an annular shape so as to enclose the p-type diffused regions 16 and the p+-type regions 17.

According to the present invention thus far described in connection with this embodiment, the following effects can be obtained. (1) A recess of any shape can be formed without any restrictions due to the crystal orientation of the semiconductor substrate by forming a local difference in impurity concentration in the semiconductor substrate, and then selectively etching the portion with the lower concentration. (2) When the recess is being formed by the etching, lateral etching is restricted by a highly doped semiconductor region of an impurity concentration of at least $10^{19}$ atoms/cm$^3$. As a result, a controlled recess is formed, and the shape of the diaphragm, particularly its size, is not changed by the etching time. (3) Because it is easy to form a circular recess in a semiconductor substrate, a silicon diaphragm with a circular recess can be formed. (4) Irregularity in strains due to the peripheral shape of the diaphragm can be eliminated by adopting a circular diaphragm in a diaphragm pressure sensor so that the temperature characteristics of diffused gauge resistors can be improved.

Other embodiments of the present invention will be described in the following.

(E1) Before step (5) of the previous embodiment, step (6) can be achieved. In this case, the diffused regions 16 for the gauge resistors are thermally influenced by the formation of the other diffused regions 17 and 18. The diffused regions 16 in particular must have very accurate resistances, so that the diffused regions 16, therefore, are preferably formed after all the other semiconductor regions have been formed.

Figure 15:
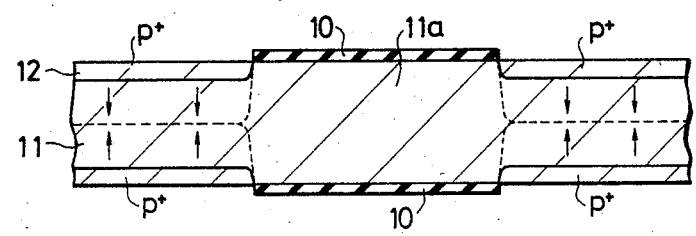
FIG. 15 is a sectional view showing a semiconductor substrate according to another embodiment of the present invention.

(E2) In order to form an even more controlled recess (or diaphragm), p-type impurities can be introduced in step (1) of the previous embodiment into both principal planes of the semiconductor substrate, as shown in FIG. 15, to form the p+-type region 12. This p+-type region 12 is made to have the shape indicated by the broken lines by the drive-in diffusion. The p+-type region 12 subjected to the drive-in diffusion can restrain lateral etching. As a result, it is easy to form a recess (or diaphragm) of a predetermined shape, independent of scattering in the etching time.

(E3) According to the present invention, it is possible to provide a semiconductor integrated circuit device in which a pressure sensor and a peripheral circuit (e.g., a temperature-compensating circuit or an amplifier circuit) required by the pressure sensor are built into a single semiconductor substrate. The peripheral circuit is constructed of at least one transistor (e.g., a bipolar transistor, or an insulated gate field effect transistor). For example, a bipolar type transistor can be formed in one n-type isolated region which is enclosed by an isolation region (the p+-type region 18 of FIG. 7). Techniques for forming such semiconductor integrated circuit device having a pressure sensor and a peripheral circuit built into a single semiconductor substrate are shown in the co-pending U.S. application of Shimizu et al, "Semiconductor Device Having a Pressure Sensor and Method of Manufacturing the Same", filed Dec. 21, 1983 (Ser. No. 563,748), the contents of which are incorporated herein by reference.

(E4) N-type impurities are introduced in the step (2) of the previous embodiment to form the n+-type buried region 13a (shown in FIG. 5). This step, i.e., the formation of the n+-type buried region 13a is important for further controlling the thickness of the diaphragm. However, that step is not essential when the diaphragm is formed by anisotropic etching.

The pressure sensor fabricated by the process of the present invention can be applied to a pressure-measuring device for an automotive engine, an oil pressure measuring device, or a clinical sphygmomanometer.

The process of the present invention can be applied not only to the formation of a diaphragm of a pressure sensor, but also to all semiconductor devices having, e.g., semiconductor elements formed to provide the semiconductor device, in which a local recess must be accurately formed in a semiconductor substrate.

What is claimed is:

1. A method of fabricating a piezoresistive semiconductor pressure sensor having a predetermined diaphragm configuration, comprising the steps of:

forming a highly doped region, in a single crystal semiconductor substrate with first and second principal planes facing each other, by covering at least part of said first principal plane by a mask for defining said predetermined diaphragm configuration, said mask having substantially the same configuration as said predetermined diaphragm configuration, and selectively introducing impurities into the portion thereof which is not covered by said mask;

forming an epitaxial semiconductor region on said second principal plane;

forming semiconductor regions for gauge resistors by selectively introducing impurities into the principal plane of the epitaxial semiconductor region positioned on a portion in which said highly doped region is not formed; and etching a portion of said first principal plane in which said highly doped region is not formed, to thereby form said predetermined diaphragm configuration, whereby a controlled recess providing the predetermined diaphragm configuration, independent of the crystal orientation of the semiconductor substrate, is formed.

2. The method of fabricating piezoresistive semiconductor pressure sensor as set forth in claim 1, wherein said single crystal semiconductor substrate is a single crystal silicon substrate of which the first and second principal planes are positioned in or adjacent to the (100) plane of said single crystal silicon substrate.

3. The method of fabricating piezoresistive semiconductor pressure sensor as set forth in claim 2, wherein the etching step is achieved by anisotropic etching using alkaline etchants.

4. The method of fabricating a piezoresistive semiconductor pressure sensor as set forth in claim 3, wherein said highly doped region has an ion impurity concentration sufficient to prevent etching of said highly doped region by said alkaline etchants.

5. The method of fabricating a piezoresistive semiconductor pressure sensor as set forth in claim 1, wherein the highly doped region has an ion impurity concentration of at least $10^{19}$ atoms/cm$^3$.

6. The method of fabricating a piezoresistive semiconductor pressure sensor as set forth in claim 1, wherein said predetermined diaphragm configuration is circular.

7. The method of fabricating a piezoresistive semiconductor pressure sensor as set forth in claim 1, wherein said etching is a chemical etching.

8. The method of fabricating a piezoresistive semiconductor pressure sensor as set forth in claim 1, further comprising the step of forming another highly doped region by selectively introducing impurities into the second principal plane at a position on the portion in which the highly doped region is not formed.

9. The method of fabricating a piezoresistive semiconductor pressure sensor as set forth in claim 1, further comprising the step of forming another highly doped region in the second principal plane of the semiconductor substrate.

10. The method of fabricating a piezoresistive semiconductor pressure sensor as set forth in claim 9, wherein the highly doped region and the another highly doped region are formed at corresponding positions in the first and second principal planes opposed to each other.

11. The method of fabricatng a piezoresistive semiconductor pressure sensor as set forth in claim 5, wherein said impurities are boron ions.

12. The method of fabricating a piezoresistive semiconductor pressure sensor as set forth in claim 1, wherein said highly doped region is formed by selectively introducing the impurities and driving the impurities into the substrate to form deep highly doped regions.

* * * * *